(12) United States Patent
Inanami

(10) Patent No.: US 7,449,700 B2
(45) Date of Patent: Nov. 11, 2008

(54) ELECTRON BEAM EXPOSURE APPARATUS, ELECTRON BEAM EXPOSURE METHOD AND METHOD OF MANUFACTURING SEMICONDUCTOR DEVICE

(75) Inventor: Ryoichi Inanami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 405 days.

(21) Appl. No.: 11/399,416

(22) Filed: Apr. 7, 2006

(65) Prior Publication Data

US 2006/0243921 A1 Nov. 2, 2006

(30) Foreign Application Priority Data

Apr. 8, 2005 (JP) ............... 2005-112117

(51) Int. Cl.
G21K 5/10 (2006.01)

(52) U.S. Cl. ............... 250/492.22; 250/492.2; 250/492.1; 250/492.23; 250/492.3; 716/19; 716/21; 430/296

(58) Field of Classification Search ....... 250/492.1, 250/492.2, 492.23, 492.22, 492.3; 716/19, 716/21; 430/296
See application file for complete search history.

(56) References Cited

U.S. PATENT DOCUMENTS

| | | | | |
|---|---|---|---|---|
| 5,283,440 | A * | 2/1994 | Sohda et al. | 250/492.2 |
| 6,316,163 | B1 * | 11/2001 | Magoshi et al. | 430/296 |
| 6,495,841 | B1 * | 12/2002 | Ando et al. | 250/492.23 |
| 6,543,044 | B2 * | 4/2003 | Inanami et al. | 716/21 |
| 6,718,532 | B2 * | 4/2004 | Inanami et al. | 716/19 |
| 6,803,589 | B2 * | 10/2004 | Nakasugi | 250/492.22 |
| 7,002,167 | B2 * | 2/2006 | Ogasawara | 250/492.22 |
| 2001/0025931 | A1 * | 10/2001 | Takamatsu et al. | 250/491.1 |
| 2001/0028991 | A1 * | 10/2001 | Inanami et al. | 430/296 |
| 2002/0142238 | A1 * | 10/2002 | Inanami | 430/30 |
| 2002/0162088 | A1 * | 10/2002 | Inanami et al. | 716/19 |
| 2003/0160192 | A1 * | 8/2003 | Inanami et al. | 250/492.23 |
| 2003/0215722 | A1 * | 11/2003 | Kanamitsu et al. | 430/5 |
| 2005/0118516 | A1 * | 6/2005 | Okumura et al. | 430/5 |
| 2006/0017013 | A1 * | 1/2006 | Ota et al. | 250/492.1 |

FOREIGN PATENT DOCUMENTS

| | | | |
|---|---|---|---|
| JP | 2001-274071 | | 10/2001 |
| JP | 2001274077 A | * | 10/2001 |

* cited by examiner

Primary Examiner—Jack I. Berman
Assistant Examiner—Michael J Logie
(74) Attorney, Agent, or Firm—Finnegan, Henderson, Farabow, Garrett & Dunner, L.L.P.

(57) ABSTRACT

An electron beam exposure apparatus has a first shaping aperture having a plurality of rectangular openings, each having sizes different from each other and shaping a beam shape of an electron beam, a rectangular opening selection deflector which controls a path of the electron beam to irradiate the electron beam on one of the plurality of rectangular openings, a second shaping aperture having a plurality of character openings, each having sizes different from each other and shaping a beam shape of the electron beam passing through the first shaping aperture, and a character beam deflector which controls the path of the electron beam to irradiate the electron beam on character openings corresponding to the rectangular openings in the first shaping aperture.

20 Claims, 4 Drawing Sheets

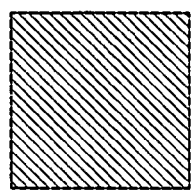
F I G. 5A
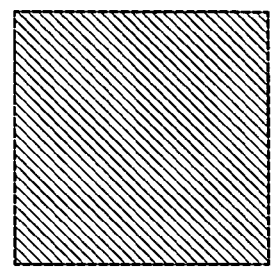
F I G. 5B
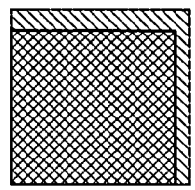
F I G. 5C
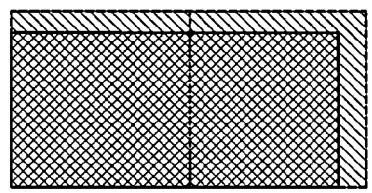
F I G. 5D
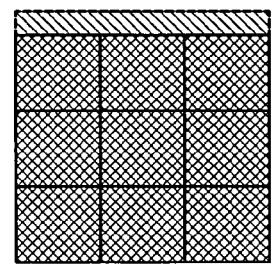
F I G. 5E
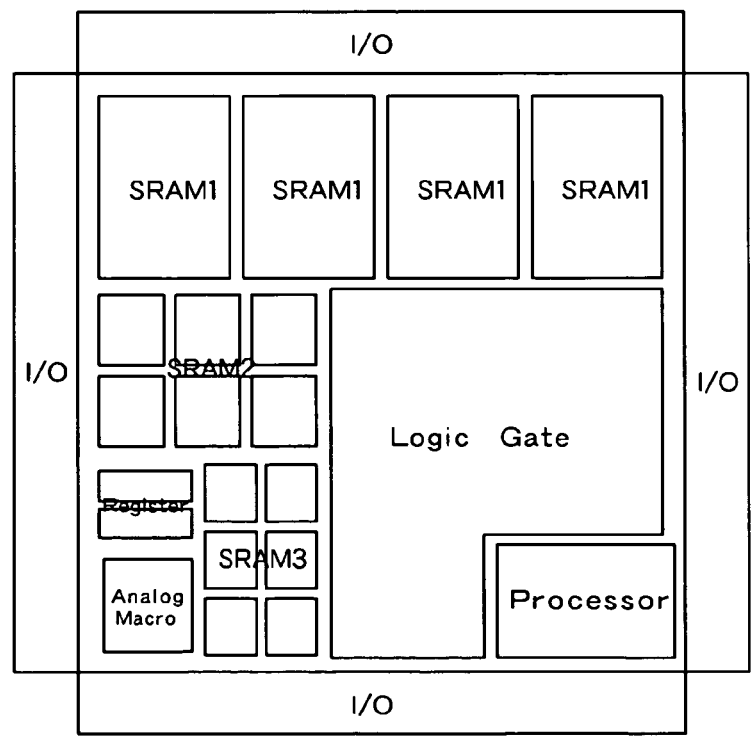
F I G. 6

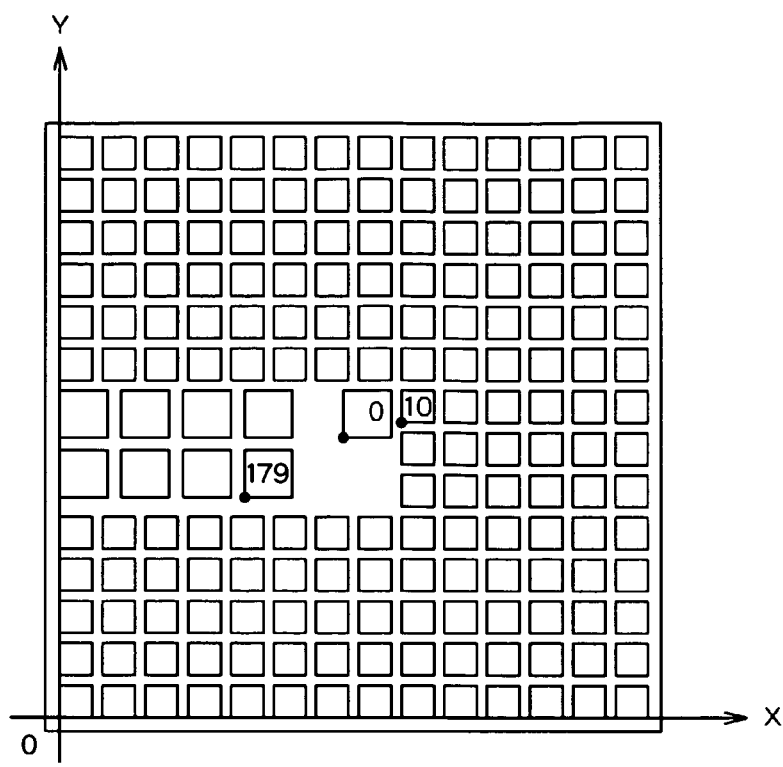
F I G. 7
F I G. 8

# ELECTRON BEAM EXPOSURE APPARATUS, ELECTRON BEAM EXPOSURE METHOD AND METHOD OF MANUFACTURING SEMICONDUCTOR DEVICE

CROSS REFERENCE TO RELATED APPLICATIONS

This application is based upon and claims the benefit of priority from the prior Japanese Patent Application No. 2005-112117, filed on Apr. 8, 2005, the entire contents of which are incorporated herein by reference.

BACKGROUND OF THE INVENTION

1. Field of the Invention

The present invention relates to an electron beam exposure apparatus and an electron beam exposure method for drawing a circuit pattern by use of electron beam.

2. Related Art

According to electron beam lithography, particularly according to an electron beam direct writing technology, when a device circuit pattern is exposed into a resist on a semiconductor substrate, masks used as a master of circuit pattern need not to be fabricated for each device. Therefore, there is an advantage in that it is possible to reduce fabrication cost and period.

Additionally, the wavelength of electron beam is significantly shorter than that of the light source of photoexposure, thus enabling shaping of a fine pattern. Therefore, the above technique has been used for device prototyping by QTAT (Quick Turn Around Time), R&D of the most advanced fine devices and the like.

In electron beam lithography using the electron beam direct writing technology, a circuit pattern to be exposed is divided into basic figures acting as an exposure unit, and then beams having the same shape and size as each basic figure are shaped by use of a plurality of shaping patterns. Electron beams shaped with the shaping aperture are directly irradiated on the resist to perform an exposure processing. Individual electron beam irradiations are called a shot.

As the electron beam shaping technique by the electron beam direct drawing technique, there have been known two methods: Variable Shaped Beam (VSB) technique and Character Projection (CP) technique.

According to VSB technique, a rectangular beam shaped by a first shaping aperture is irradiated on part of an opening having the same rectangular shape of a second shaping aperture to shape a rectangular (oblong) beam of a given size.

According to CP technique, a rectangular beam shaped by a first shaping aperture is irradiated on an opening of a given shape formed in a second shaping aperture to shape a beam having the same shape as the opening. The resultant beam shape is called a character, and the opening is called a character opening.

In the electron beam writing based on CP technique, exposure can be performed with a beam shape corresponding to a character opening preliminarily formed in the second shaping aperture. Thus, compared to in the case that beam irradiation using basic shapes is repeated, as with VSB method, to shape a pattern of a given shape, the number of shots can be reduced and drawing time can also be shortened.

The present inventor has proposed a technique of arranging as a character in a second shaping aperture a standard cell constituting a logic device in order to efficiently draw the logic device pattern of small production type directly on a wafer using the electron beam writing based on CP technique (refer to Japanese Patent Laid-Open No. 2001-274071).

However, as semiconductor device patterns are miniaturized, the size of cell in the device also becomes smaller. Accordingly, even if individual standard cells are provided as a character, the number of shots per wafer increases, thereby making it impossible to shorten drawing time and thus lowering drawing throughput.

SUMMARY OF THE INVENTION

According to one embodiment of the present invention, an electron beam exposure apparatus, comprising:

a first shaping aperture having a plurality of rectangular openings, each having sizes different from each other and shaping a beam shape of an electron beam;

a rectangular opening selection deflector which controls a path of the electron beam to irradiate the electron beam on one of the plurality of rectangular openings;

a second shaping aperture having a plurality of character openings, each having sizes different from each other and shaping a beam shape of the electron beam passing through the first shaping aperture; and a character beam deflector which controls the path of the electron beam to irradiate the electron beam on character openings corresponding to the rectangular openings in the first shaping aperture.

Furthermore, according to one embodiment of the present invention, an electron beam exposure method, comprising:

irradiating an electron beam on a first shaping aperture having a plurality of rectangular openings, each having sizes different from each other and shaping a beam shape of the electron beam;

controlling a path of the electron beam to irradiate the electron beam on one of the plurality of rectangular openings;

irradiating the electron beam passing through the first shaping aperture on a second shaping aperture having a plurality of character openings, each having sizes different from each other and shaping a beam shape of the electron beam; and controlling the path of the electron beam by a character deflector to irradiate the electron beam on character openings corresponding to the rectangular openings in the first shaping aperture.

Furthermore, according to one embodiment of the present invention, a method of manufacturing semiconductor device, comprising:

irradiating an electron beam on a first shaping aperture having a plurality of rectangular openings, each having sizes different from each other and shaping a beam shape of the electron beam;

controlling a path of the electron beam to irradiate the electron beam on one of the plurality of rectangular openings;

irradiating the electron beam passing through the first shaping aperture on a second shaping aperture having a plurality of character openings, each having sizes different from each other and shaping a beam shape of the electron beam;

controlling the path of the electron beam by a character deflector to irradiate the electron beam on character openings corresponding to the rectangular openings in the first shaping aperture; and irradiating the electron beam passing through the character opening on a wafer to fabricate a semiconductor device.

BRIEF DESCRIPTION OF THE DRAWINGS

FIGS. 5A-5E are views showing an exemplary size of the second shaping aperture 11.

FIG. 6 is a schematic layout diagram showing an example of system LSI.

FIG. 7 is a view explaining coordinates in the second shaping aperture.

FIG. 8 is a view showing an example of character table stored in the drawing information storage unit 17.

DETAILED DESCRIPTION OF THE INVENTION

One embodiment of the present invention will be described below with reference to the drawings.

Figure 1:
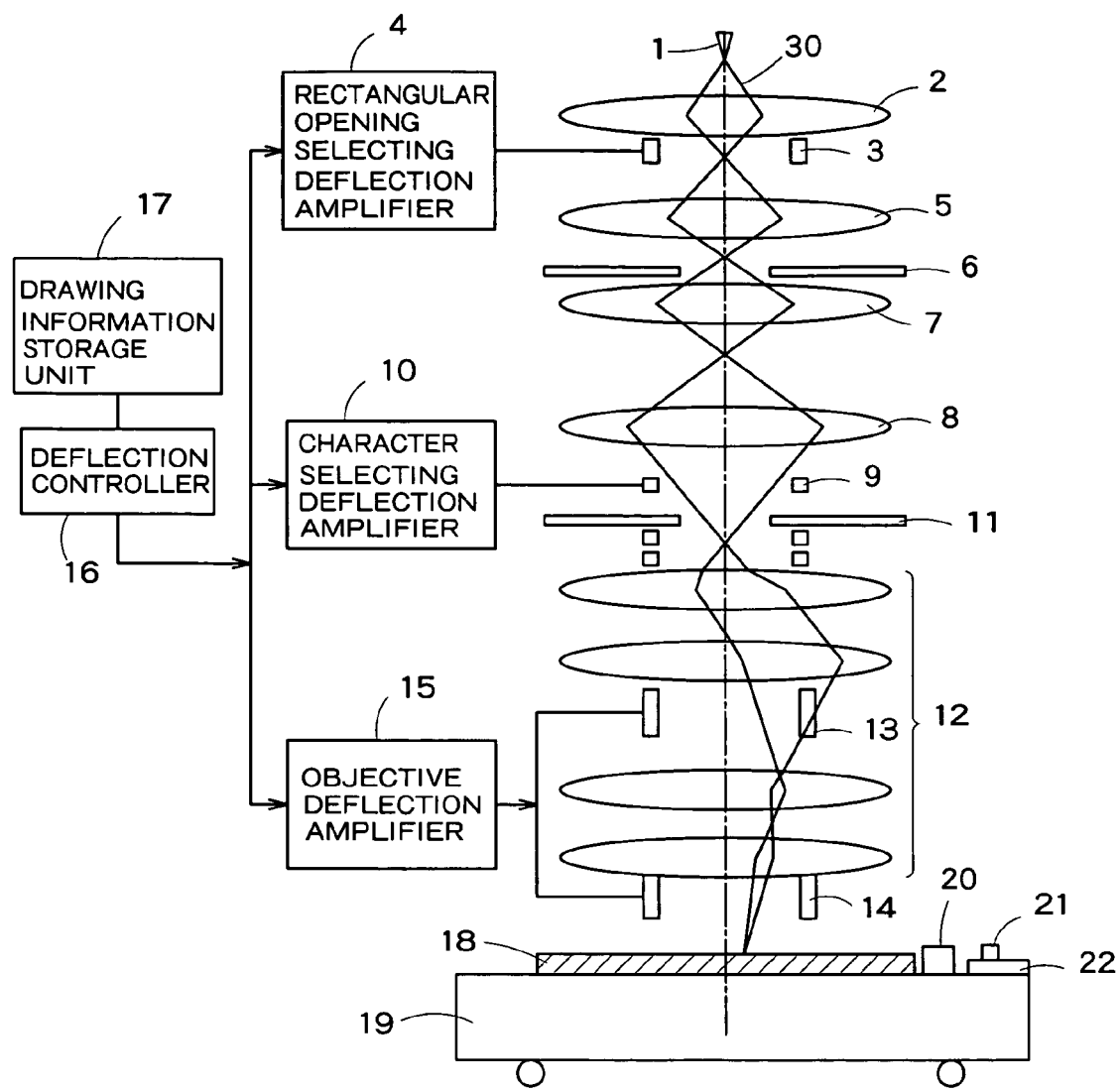
FIG. 1 is a view showing a schematic configuration of an electron beam exposure apparatus according to one embodiment of the present invention.

FIG. 1 is a view showing a schematic configuration of an electron beam exposure apparatus according to one embodiment of the present invention. The electron beam exposure apparatus of FIG. 1 includes an electron gun 1, a first condenser lens 2, a rectangular opening selection deflector 3, a rectangular opening selecting deflection amplifier 4, a second condenser lens 5, a first shaping aperture 6, a first projection lens 7, a second projection lens 8, a character selection deflector 9, a character selecting deflection amplifier 10, a second shaping aperture 11, an imaging lens system 12, an objective deflection amplifier 15 controlling a primary objective deflector 13 and a secondary objective deflector 14 of the lens system 12, a deflection controller 16, a drawing information storage unit 17 storing information relating to a circuit pattern drawing method, a movable stage 19 mounting a wafer 18, a Faraday cup 20 placed on the stage 19, a heavy metal particle mark 21 and an electron beam measurement mark platform 22.

The operating principle of the electron beam exposure apparatus of FIG. 1 will be briefly described below. The first condenser lens 2 and the second condenser lens 3 adjust current density and Koehler illumination condition of an electron beam emitted from the electron gun 1. The adjusted electron beam is guided to the first shaping aperture 6.

Figure 2:
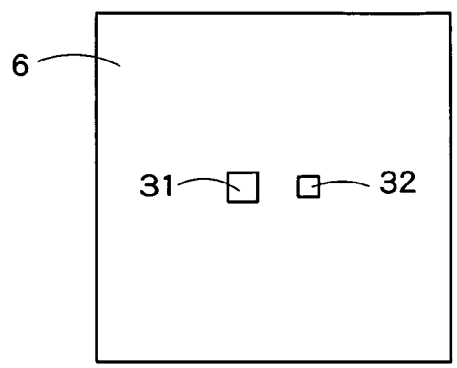
FIG. 2 is a plan view showing an example of the first shaping aperture 6.

In the first shaping aperture 6, there are a plurality of rectangular openings having a different size from each other. FIG. 2 is a plan view showing an example of the first shaping aperture 6. In the example of FIG. 2, two rectangular openings 31 and 32 of a different size from each other are formed in the first shaping aperture 6. Three or more rectangular openings of a different size from each other may be arranged in the first shaping aperture 6.

The electron beam is deflected by the rectangular opening selection deflector 3 and irradiated on one selected from among the plurality of rectangular openings 31 and 32 formed in the first shaping aperture 6.

The electron beam passes through a specific rectangular opening within the first shaping aperture 6, and then is focused on the second shaping aperture 11 through the first projection lens 7 and the second projection lens 8. On the second shaping aperture 11, there are formed a plurality of character openings of a plurality of shapes and sizes, and a rectangular opening (hereinafter referred to as a VSB opening) used in drawing based on VSB technique.

The electron beam is deflected by the character selection deflector 9 and irradiated on one selected from among the plurality of openings formed in the second shaping aperture 11.

The rectangular opening selection deflector 3 and the character selection deflector 9 are controlled by the deflection controller 16. The control method will be described later.

Figures 3A, 3B:
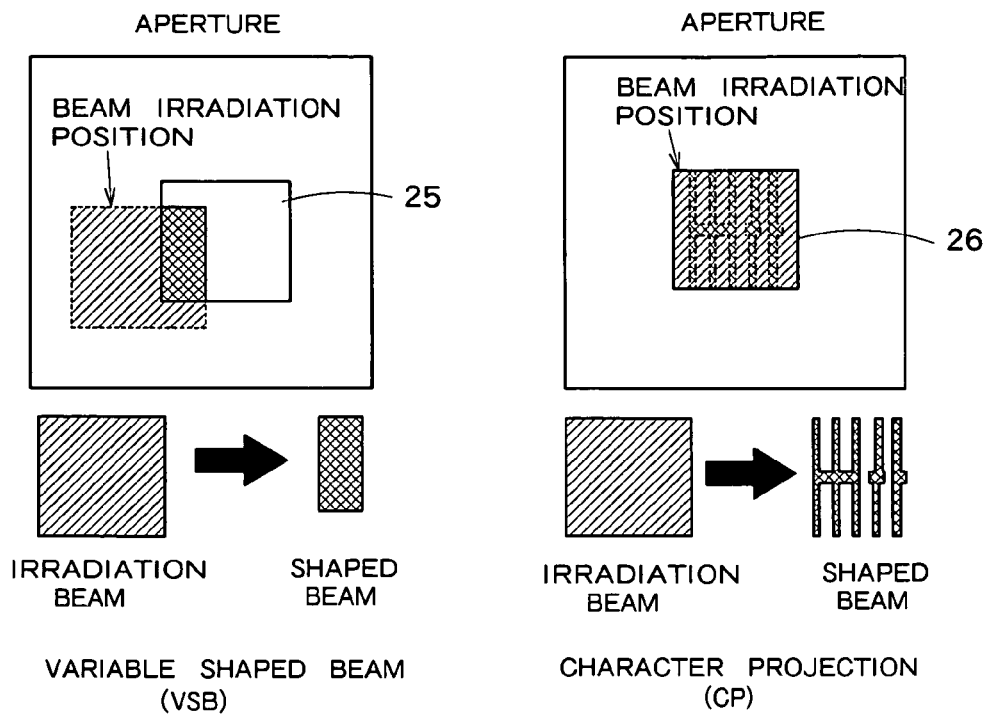
FIGS. 3A-3B are views for explaining a drawing process based on VSB technique and a drawing process based on CP technique.

FIG. 3 is a view for explaining a drawing process based on VSB technique and a drawing process based on CP technique. In VSB technique, as shown in FIG. 3A, an electron beam is irradiated on part of a VSB opening 25 to form a rectangular beam of a given shape. Meanwhile, in CP method, an electron beam is irradiated on a character opening 26 preliminarily processed into a given shape to form a beam corresponding to the shape of the character opening 26, as shown in FIG. 3B.

Returning to FIG. 1, the electron beam passes through the second shaping aperture 11, and then is reduced by the imaging lens system 12 and focused on the wafer 18. The electron beam focusing position within the wafer 18 is adjusted by the primary objective deflector 13 and the secondary objective deflector 14 based on a control by the objective deflection amplifier 15.

The Faraday cup 20 and the heavy metal particle mark 21 are used to specify an electron beam irradiating position on the stage 19.

Figure 4:
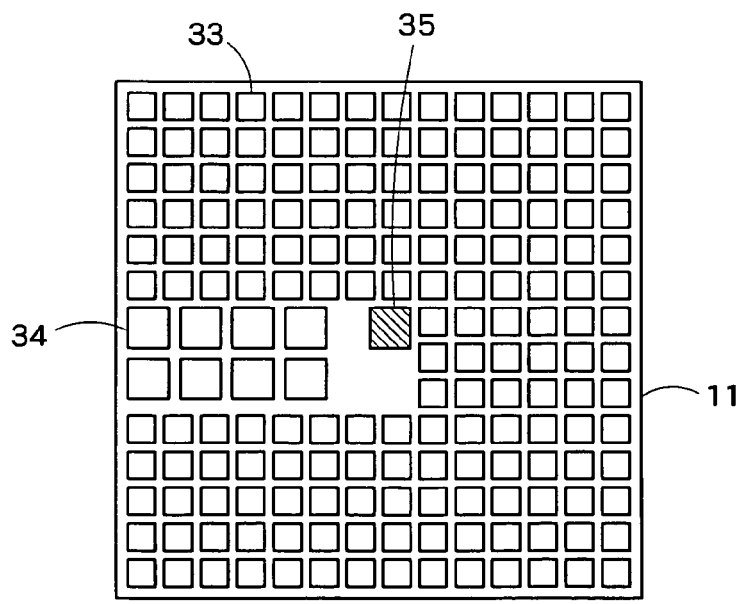
FIG. 4 is a plan view showing an example of the second shaping aperture 11.

FIG. 4 is a plan view showing an example of the second shaping aperture 11. In the example of FIG. 4, there are formed first character openings 33 of small size having a different shape from each other, second character openings 34 of large size having a different shape from each other, and a VSB opening. A plurality of the first character openings 33 are provided. Each of the first character openings has the same size, but has a different shape. Similarly, a plurality of the second character openings 34 are provided. Each of the second character openings 34 has the same size, but has a different shape.

As shown in FIG. 2, in the first shaping aperture 6, there are a plurality of rectangular openings having a different size. In accordance with a rectangular opening selected in the first shaping aperture 6, a character opening is selected from the second shaping aperture 11. For example, the first character opening 33 of small size in the second shaping aperture 11 is selected when the rectangular aperture of small size is selected from the first shaping aperture 6. Similarly, the second character opening 34 of large size and the VSB opening in the second shaping aperture 11 are selected when the rectangular aperture of large size is selected from the first shaping aperture 6.

Conventionally, only character openings having the same size are arranged in the second shaping aperture 11, Therefore, the number of openings capable of be formed in the second shaping aperture 11 has been limited. However, according to the present embodiment, the first character openings 33 of small size and the second character openings 34 of large size are formed. Consequently, the number of openings capable of being formed in the second shaping aperture 11 can be increased, as compared with conventional art. Therefore, more various shapes of circuit patterns can be formed with one shot of exposure, thereby reducing the number of shots.

In FIG. 4, the pitch between the first character openings 33 and the pitch between the second character openings 34 are different from each other, and the second character openings 34 and the VSB opening 35 are formed near the center. However, arrangement of the openings and the number of the openings are not especially limited.

As one example, the VSB opening 35 and the second character opening 34 are each about 5 μm square on the wafer 18. The actual beam size on the second shaping aperture 11 is several times to several tens of times as large as the beam size on the wafer 18. The electron beam shaped by the second shaping aperture 11 is reduced and then imprinted onto the wafer 18.

The second shaping aperture 11 of FIG. 4 has one VSB opening 35, 168 pieces of first character openings 33 with 3.5 μm square on the wafer, and 8 pieces of second character openings 34 with 5 μm square on the wafer. For example, when the second character opening 34 is not needed, the first character opening 33 can be disposed in that position. In this case, 192 pieces of first character openings 33 can be formed in the whole second shaping aperture 11.

Meanwhile, the rectangular opening 31 of large size within the first shaping aperture 6 is, for example, 5 μm square on the wafer, and the rectangular opening of small size is, for example, 3.5 μm square on the wafer.

FIG. 5 is a view showing an exemplary size of the second shaping aperture 11. FIG. 5A shows the first character opening 33, and FIG. 5B shows the second character opening 34. When a standard cell of small size indicated by the shaded area of FIG. 5C is drawn, the first character opening 33 of FIG. 5A is used. When a standard cell of large size as shown in FIG. 5D is drawn, the drawing is performed by a plurality of shots using the first character opening 33 of FIG. 5A. Also, when a memory cell having a repeating structure of small-size cells, as shown shaded small rectangles in FIG. 5E, is drawn, the drawing is performed in one shot for plural cells using one of the second character openings 34.

FIG. 6 is a schematic layout diagram showing an example of system LSI. SRAM1 to SRAM3 of FIG. 6 have a repeating structure, are drawn at one shot by use of the second character openings 34 in the second shaping aperture. Meanwhile, logic gate circuits and processors have random structures having little repetition. Therefore, exposure is performed with the first character opening 33 of small size. When the logic gate circuits and the processors are drawn, it is desirable to provide as many as possible of the first character openings 33 having shapes different from each other.

As described above, the second shaping aperture 11 has a plurality of openings of different sizes and shapes. Therefore, to perform drawing, it is needed to specify which opening should be used for drawing. Thus, according to the present embodiment, as shown in FIG. 7, an opening is specified by use of coordinates (X, Y) indicating the position of all openings in the second shaping aperture 11.

In FIG. 7, original point "O" is set at the central position in the second shaping aperture 11. However, original point "O" may be set at another position. In this case, original point "O" must be set at a position which can be properly identified by a control system controlling electron beam writing (rectangular opening selecting deflection amplifier 4, character selection deflection amplifier 10 and the like) and from which deflection quantity can be properly detected.

Also, in accordance with the size of a rectangular opening selected by the first shaping aperture 6, an opening must be selected in the second shaping aperture 11. Therefore, it is also necessary to specify a relationship between the size of rectangular opening selected in the first shaping aperture 6 and the kind of opening selected in the second shaping aperture 11.

Thus, according to the present embodiment, drawing information indicating the relationship between an opening selected by the first shaping aperture 6 and an opening selected by the second shaping aperture 11 is stored in the drawing information storage unit 17. The deflection controller 16 reads sequentially the drawing information from the drawing information storage unit 17 and controls the rectangular opening selecting deflection amplifier 4 and the character selecting deflection amplifier 10.

FIG. 8 is a view showing an example of character table stored in the drawing information storage unit 17. As shown in FIG. 8, the drawing information storage unit 17 stores character IDs for specifying the characters to be drawn by the respective shots, the sizes of rectangular openings selected by the first shaping aperture 6, and coordinates of the openings and opening types (comment) selected by the second shaping aperture 11.

In FIG. 8, character ID of a VSB opening 35 in the vicinity of the center is "0" and its coordinates are (X0, Y0). An adjoining first character opening 33 of small size on the right side of the VSB opening 35 is used to draw a standard cell, and its character ID is "10" and its coordinates are (X10, Y10). Meanwhile, a second character opening 34 of large size on the left side of original point O is used to draw a number (8) of SRAM cells, and its character ID is "179" and its coordinates are (X179, Y179).

In FIGS. 7 and 8, coordinates are set based on a vertex at the lower left corner of each opening. However, coordinates may be set based on another position. In this case, the setting is preferably standardized for all openings.

In the character table of FIG. 8, the two rectangular openings in the first shaping aperture 6 are represented by "0" and "1". This is ID for specifying the size of rectangular opening. When there exist three or more kinds of rectangular openings, the number of bits of ID may be increased accordingly. Alternatively, information for identifying each rectangular opening within the first shaping aperture 6 may be stored in the character table.

The character table of FIG. 8 is provided for each combination of the first shaping aperture 6 and second shaping aperture 11. Thus, when the first shaping aperture 6 or the second shaping aperture 11 is changed to another aperture, the character table must also be changed. When the circuit pattern to be drawn is changed, a new character table must be prepared.

The character table of FIG. 8 is shown as an example; any information other than one shown in FIG. 8 may be added or modified.

In this manner, according to the present embodiment, a plurality of rectangular openings of different sizes are arranged in the first shaping aperture 6, and in accordance with this, a plurality of character openings of different sizes are arranged in the second shaping aperture 11. Accordingly, optimum opening sizes can be selected according to the circuit pattern, thereby reducing the number of shots. Particularly, since the second shaping aperture 11 has a plurality of character openings of different sizes, as compared to conventional art, the number of character openings in the second shaping aperture 11 can be increased, so character openings corresponding to circuit patterns of various shapes can be preliminarily prepared. Consequently, the number of shots can be significantly reduced.

More specifically, in terms of circuit patterns of a repeating structure, such as SRAM cell, drawing can be performed at one shot for plural cells by use of character openings of large size. Therefore, exposure can be efficiently performed in a short time.

In terms of circuit patterns of a complex shape having little repetition, such as logic circuit, i.e. in terms of the circuit patterns of a combination logic circuit and a sequential circuit, when many character openings of small size are preliminarily arranged, exposure can be performed by a smaller number of shots. Accordingly, in the case of circuit patterns having logic circuits and memory cells mixed therein, when the kind of character opening is selected according to the position within the wafer 18, drawing can be rapidly performed with excellent reliability. Even when the degree of integration of semiconductor device increases in the future, the present embodiment is substantially applicable.

Furthermore, according to the present embodiment, drawing information indicating the relationship between character ID of each shot, the size of rectangular opening in the first shaping aperture 6, and the position and kind of character opening in the second shaping aperture 11, is stored in the drawing information storage unit 17. Accordingly, when each aperture is controlled according to the drawing information, drawing can be performed easily and quickly.

What is claimed is:

1. An electron beam exposure apparatus, comprising:
    a first shaping aperture having a plurality of rectangular openings, each having sizes different from each other and shaping a beam shape of an electron beam;
    a rectangular opening selection deflector which controls a path of the electron beam to irradiate the electron beam on one of the plurality of rectangular openings;
    a second shaping aperture having a plurality of character openings, each having sizes different from each other and shaping a beam shape of the electron beam passing through the first shaping aperture; and
    a character beam deflector which controls the path of the electron beam to irradiate the electron beam on character openings corresponding to the rectangular openings in the first shaping aperture.

2. The electron beam exposure apparatus according to claim 1,
    wherein the second shaping aperture includes a character opening of a first size which is suitable for drawing of repetitive structure, a character opening of a second size smaller than the first size which is suitable for drawing of random structure, and a character opening for shaping a variable shaped beam (VSB).

3. The electron beam exposure apparatus according to claim 2,
    wherein the character beam deflector uses the character opening of the second size when a combination logic circuit and a sequential circuit are drawn, and uses the character opening of the first size when a memory cell circuit is drawn.

4. The electron beam exposure apparatus according to claim 1, further comprising a deflection controller which controls the rectangular opening selection deflector and the character beam deflector in accordance with a circuit type to be drawn.

5. The electron beam exposure apparatus according to claim 1, further comprising:
    an aperture information storage which stores drawing information showing a correspondence relationship between first information indicative of sizes and types of the rectangular openings in the first shaping aperture and second information relating to positions and types of the character openings in the second shaping aperture; and
    a drawing controller which controls the rectangular opening selection deflector and the character beam deflector based on drawing information stored in the aperture information storage.

6. The electron beam exposure apparatus according to claim 5,
    wherein the aperture information storage stores the drawing information including character ID information indicative of character shape to be drawn; and
    the drawing controller reads out the drawing information corresponding to the character ID information and controls the rectangular opening selection deflector and the character beam deflector.

7. The electron beam exposure apparatus according to claim 5,
    wherein the aperture information storage has a character table indicative of a correspondence relationship of the character ID information, the first information and the second information.

8. An electron beam exposure method, comprising:
    irradiating an electron beam on a first shaping aperture having a plurality of rectangular openings, each having sizes different from each other and shaping a beam shape of the electron beam;
    controlling a path of the electron beam to irradiate the electron beam on one of the plurality of rectangular openings;
    irradiating the electron beam passing through the first shaping aperture on a second shaping aperture having a plurality of character openings, each having sizes different from each other and shaping a beam shape of the electron beam; and
    controlling the path of the electron beam by a character deflector to irradiate the electron beam on character openings corresponding to the rectangular openings in the first shaping aperture.

9. The electron beam exposure method according to claim 8,
    wherein the second shaping aperture includes a character opening of a first size which is suitable for drawing of repetitive structure, a character opening of a second size smaller than the first size which is suitable for drawing of random structure, and a character opening for shaping a variable shaped beam (VSB).

10. The electron beam exposure method according to claim 9,
    wherein the character beam deflector uses the character opening of the second size when a combination logic circuit and a sequential circuit are drawn, and uses the character opening of the first size when a memory cell circuit is drawn.

11. The electron beam exposure method according to claim 8,
    wherein the rectangular opening selection deflector and the character beam deflector are controlled in accordance with the types of the circuit to be drawn.

12. The electron beam exposure method according to claim 8, further comprising:
    controlling the rectangular opening selection deflector and the character beam deflector based on drawing information stored in an aperture information storage which stores the drawing information indicative of a correspondence relationship between first information indicative of sizes or types of the rectangular openings in the first shaping aperture and second information relating to positions and types of the character openings in the second shaping aperture.

13. The electron beam exposure method according to claim 12, wherein the aperture information storage stores the drawing information including character ID information indicative of character shapes to be drawn; and when controlling the character beam deflector, the drawing information corresponding to the character ID information is read out from the aperture information storage and controls the rectangular opening selection deflector and the character beam deflector.

14. The electron beam exposure method according to claim 12, wherein the aperture information storage has a character table indicative of a correspondence relationship of the character ID information, the first information and the second information.

15. A method of manufacturing semiconductor device, comprising:

irradiating an electron beam on a first shaping aperture having a plurality of rectangular openings, each having sizes different from each other and shaping a beam shape of the electron beam;

controlling a path of the electron beam to irradiate the electron beam on one of the plurality of rectangular openings;

irradiating the electron beam passing through the first shaping aperture on a second shaping aperture having a plurality of character openings, each having sizes different from each other and shaping a beam shape of the electron beam;

controlling the path of the electron beam by a character deflector to irradiate the electron beam on character openings corresponding to the rectangular openings in the first shaping aperture; and irradiating the electron beam passing through the character opening on a wafer to fabricate a semiconductor device.

16. The method of manufacturing semiconductor device according to claim 15, wherein the second shaping aperture includes a character opening of a first size which is suitable for drawing of repetitive structure, a character opening of a second size smaller than the first size which is suitable for drawing of random structure, and a character opening for shaping a variable shaped beam (VSB).

17. The method of manufacturing semiconductor device according to claim 16, wherein the character beam deflector uses the character opening of the second size when a combination logic circuit and a sequential circuit are drawn, and uses the character opening of the first size when a memory cell circuit is drawn.

18. The method of manufacturing semiconductor device according to claim 15, wherein the rectangular opening selection deflector and the character beam deflector are controlled in accordance with the types of the circuit to be drawn.

19. The method of manufacturing semiconductor device according to claim 15, further comprising:

controlling the rectangular opening selection deflector and the character beam deflector based on drawing information stored in an aperture information storage which stores the drawing information indicative of a correspondence relationship between first information indicative of sizes or types of the rectangular openings in the first shaping aperture and second information relating to positions and types of the character openings in the second shaping aperture.

20. The method of manufacturing semiconductor device according to claim 19, wherein the aperture information storage stores the drawing information including character ID information indicative of character shapes to be drawn; and when controlling the character beam deflector, the drawing information corresponding to the character ID information is read out from the aperture information storage and controls the rectangular opening selection deflector and the character beam deflector.

* * * * *